United States Patent [19]

Ozawa

[11] Patent Number: 4,620,298
[45] Date of Patent: Oct. 28, 1986

[54] HIGH-SPEED OUTPUT CIRCUIT

[75] Inventor: Takashi Ozawa, Tokyo, Japan

[73] Assignee: NEC, Tokyo, Japan

[21] Appl. No.: 561,368

[22] Filed: Dec. 14, 1983

[30] Foreign Application Priority Data

Dec. 14, 1982 [JP] Japan .................................. 57-218687

[51] Int. Cl.⁴ ............................................ G11C 11/40
[52] U.S. Cl. ...................................... 365/189; 365/230
[58] Field of Search ................. 365/154, 189, 230, 205

[56] References Cited

U.S. PATENT DOCUMENTS 4,441,172 4/1984 Ebel ..................................... 365/189

Primary Examiner—Terrell W. Fears
Attorney, Agent, or Firm—Sughrue, Mion, Zinn Macpeak & Seas

[57] ABSTRACT

An output circuit which can operate at a high-speed is disclosed. The output circuit comprises a series circuit of first and second transistors constituted in a push-pull structure, a third transistor coupled between the control electrodes of the first and second transistors, and control means for making the third transistor conducting prior to establishment of logic states at the control electrodes of the first and second transistors.

9 Claims, 6 Drawing Figures

HIGH-SPEED OUTPUT CIRCUIT

BACKGROUND OF THE INVENTION

The present invention relates to an output circuit constituted of insulated-gate field-effect transistors (hereinafter referred to as MISFETs), and more particularly to the output circuit in a semiconductor integrated circuit memory device.

Memory circuits and logic circuits generally have output circuits through which data read out from the memory circuit and data logically processed in the logic circuits are outputted. Such an output circuit may be a push-pull circuit in which two MISFETs are connected in series between two terminals of a power source and true and complementary input signals are supplied to the gates of these two MISFETs, respectively. An output is taken from the connecting point of these two MISFETs. Output circuits are generally required to drive their comparatively large load capacitances at a high speed. Consequently, the above-mentioned two MISFETs are large in size and, hence, their gate capacitances are also large. Therefore, in the case where immediately after delivering a logical data the output circuit delivers the opposite logical data, a substantial amount of time is required for inverting the gate potential of each of the above-mentioned MISFETs, resulting in low operating speed.

SUMMARY OF THE INVENTION

Accordingly, an object of the invention is to provide an output circuit improved in operating speed.

To this end, according to the invention, a short-circuiting means is provided between the gates of the two MISFETs of the push-pull circuit. Before the input signals are supplied to the gates of the push-pull MISFETs, a difference in level between the gates is removed by the short-circuiting means.

According to the invention, since the gates of the push-pull MISFETs are short-circuited, the difference in level therebetween resulting from the previous input data is removed, and the potentials at the gates of the push-pull MISFETs are set at a substantially intermediate level of binary logic levels. Therefore, the subsequent input data can determine the potentials at the gates of the push-pull MISFETs at a high speed.

DESCRIPTION OF THE PREFERRED EMBODIMENTS

In the following description, N-channel MISFETs are employed as MISFETs and a power source $V_{CC}$ is assumed to be a positive power source. In addition, the MISFETs are enhancement-mode transistors unless otherwise specified.

Prior Art

Figure 1:
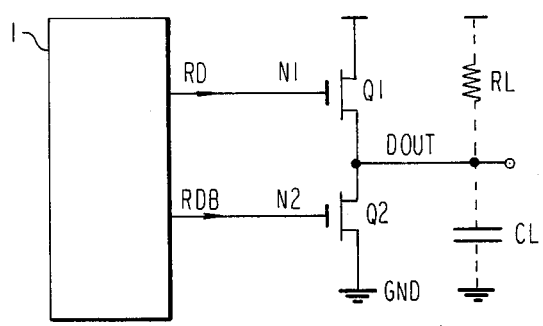
FIG. 1 shows an example of a conventional output circuit.

An example of a prior art output circuit constituted of MISFETs will be explained hereinunder with reference to FIG. 1. MISFETs $Q_1$ and $Q_2$ are enhancement-mode transistors constituting an output inverter of a push-pull type. The drain terminal of the MISFET $Q_1$ is connected to a power source terminal $V_{CC}$ of the circuit, while the source thereof is connected to an output terminal DOUT. The drain terminal of the MISFET $Q_2$ is connected to the output terminal DOUT, while the source terminal thereof is connected to the ground terminal GND. To gate terminals $N_1$ and $N_2$ of the MISFETs $Q_1$ and $Q_2$, true and complementary signals RD and RDB are fed from a read-out data amplifying circuit 1, respectively. In this case, when the MISFET $Q_1$ is conducting (ON), the MISFET $Q_2$ is non-conducting (OFF) and a HIGH (the $V_{CC}$ side) level output is delivered to the output terminal DOUT. To the contrary, when the MISFET $Q_2$ is ON, the MISFET $Q_1$ is OFF and a LOW (the GND side) level output is delivered to the output terminal DOUT. In this case, as described hereinbefore, the MISFETs $Q_1$ and $Q_2$ are required to have a larger gate width in order to drive loads (e.g., a capacitance CL and a resistance RL) connected to the output terminal DOUT at a high speed. Since in such a case the gate capacitances, i.e., the capacitances of the terminals $N_1$ and $N_2$ also increase, a substantial amount of time is required for the gate input signals RD and RDB to be inverted from the previous data, resulting in an undesirable extension of the reading time.

Embodiments of the Invention

Figure 2:
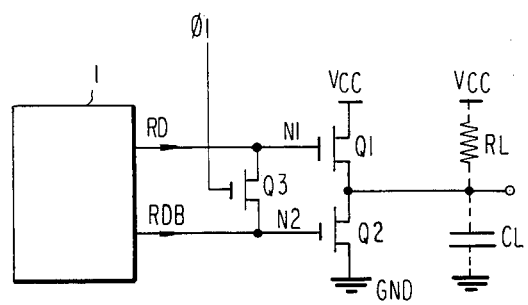
FIG. 2 shows an embodiment of the invention.

An embodiment of the invention will be described hereinunder with reference to FIG. 2. In FIGS. 1 and 2, like reference numerals denote like members or portions. An MISFET $Q_3$ is connected between the terminals $N_1$ and $N_2$ and constitutes a short-circuiting means in accordance with the invention. The drain (or source) terminal of the MISFET $Q_3$ is connected to the gate terminal $N_1$ of the MISFET $Q_1$, while the source (or drain) terminal of the MISFET $Q_3$ is connected to the gate terminal $N_2$ of the MISFET $Q_2$. A control signal $\phi_1$ is applied to the gate terminal of the MISFET $Q_3$. The control signal $\phi_1$ is a pulse which is generated and extinguished before the output state of the read-out data amplifying circuit 1 is determined. For example, when the output circuit is employed in a memory circuit for delivering read-out data, the control signal $\phi_1$ is preferably a one-shot pulse which is generated immediately after address inputs are changed over, and the MISFET $Q_3$ is held ON only while the pulse signal is being generated.

Figure 3:
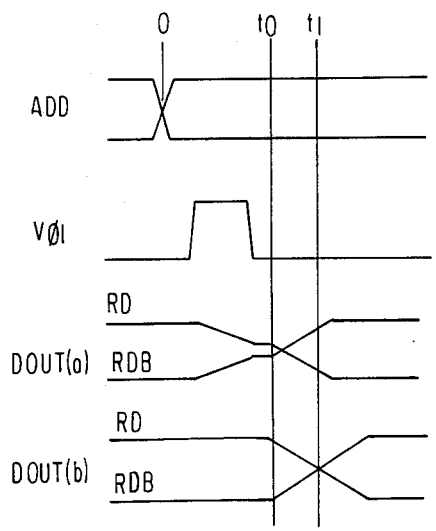
FIG. 3 is a waveform chart for illustrating an example of the operation of the embodiment shown in FIG. 2.

The operation of this embodiment will be explained hereinunder with reference to FIG. 3. In this case, the read-out data amplifying circuit 1 is employed for reading out data stored in a memory. A reference symbol AND denotes address input signals for the memory to which the present invention is applied, while a symbol $V\phi_1$ represents the potential of the control signal $\phi_1$. In addition, a symbol DOUT(a) indicates the potentials at the gate terminals $N_1$ and $N_2$ in the circuit in accordance with the invention, while a symbol DOUT(b) expresses the potentials at the gate terminals $N_1$ and $N_2$ in the prior art circuit, i.e. in the case where the MISFET $Q_3$ is not present, for the purpose of comparison. Moreover, the time $t_0$ shows the time at which the read-out data amplifying circuit 1 starts to amplify true and complementary read-out data after address inputs ADD are established. During the period between the time 0 to the time $t_0$, an unbalance in level of the read-out data on the previous cycle is left between the nodes $N_1$ and $N_2$. The gate potentials DOUT(b) in the prior art circuit start to change after the time $t_0$, and the change is slow since the gate capacitances are large as described hereinbefore, so that the gate potentials are inverted at the time $t_1$. On the other hand, in the circuit of the invention, the control signal $\phi_1$ (one-shot pulse) is generated and extinguished before the time $t_0$ at which the read-out data amplifying circuit 1 determines data. Therefore, the MISFET $Q_3$ permits a balancing function to decrease the difference between the gate potentials. In consequence, the gate potential inverting time from the time $t_0$ is shorter than that of the gate potentials DOUT(b) of the prior art circuit, so that the reading time can be reduced.

Figure 4:
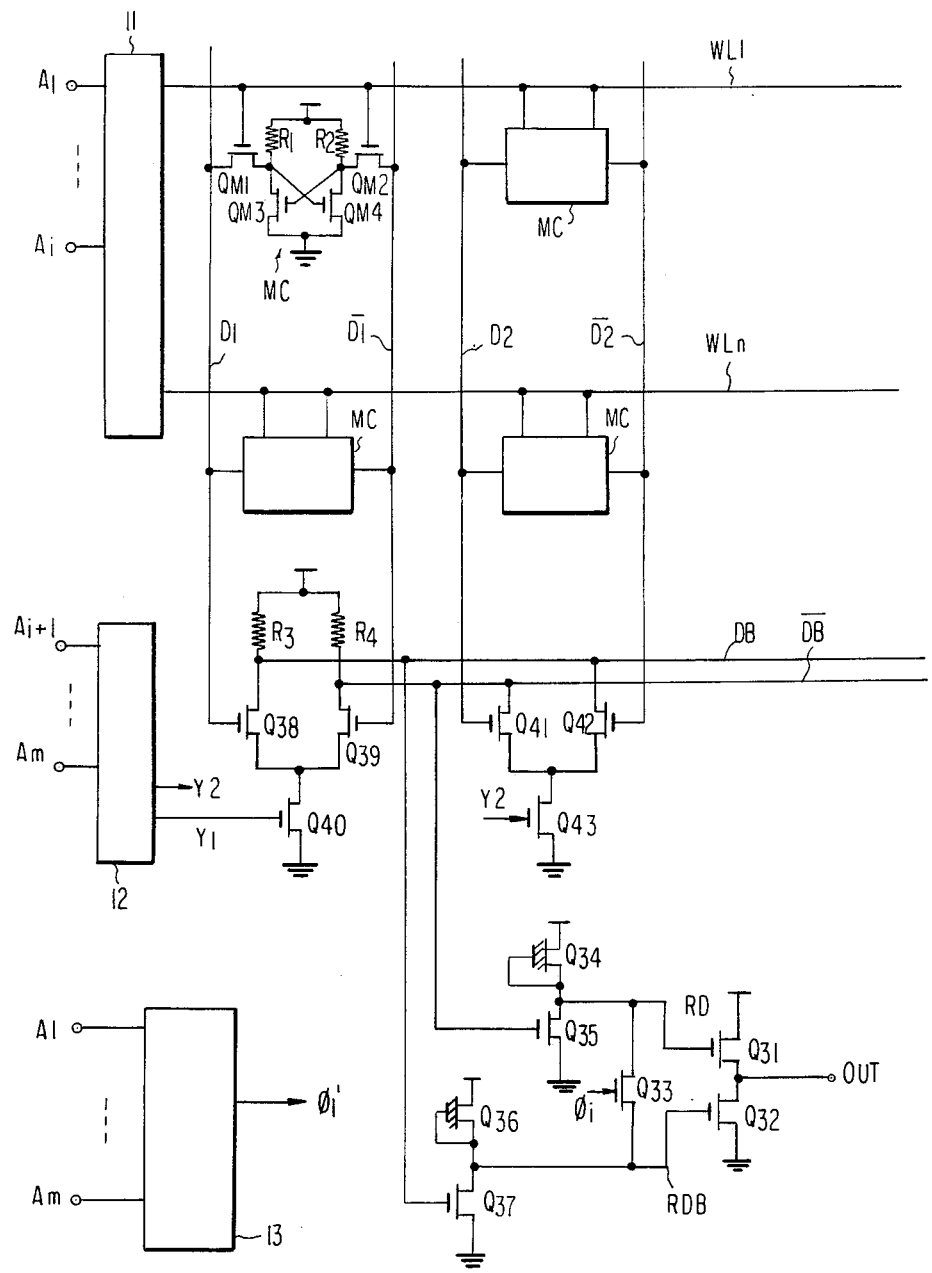
FIG. 4 shows a practical embodiment in which the invention is applied to an output circuit in a memory.

A practical embodiment of the invention will be described hereinunder with reference to FIG. 4.

In this embodiment, the output circuit of the invention is assembled in a memory circuit.

Static memory cells MC are disposed at intersections between word lines $WL_1$ to $WL_n$ and digit line pairs $(D_1, \overline{D_1})$, $(D_2, \overline{D_2})$..., respectively. Each memory cell MC is constituted by load resistors $R_1$ and $R_2$ and cross-coupled MISFETs $Q_{M3}$ and $Q_{M4}$, which in combination constitute a flip-flop, and MISFETs $Q_{M1}$ and $Q_{M2}$ operate as transfer gates. A row decoder 11 is adapted to select a word line on receipt of row address signals $A_1$ to $A_i$. MISFETs $Q_{38}$ to $Q_{40}$ in combination constitute a differential sense amplifier provided for a digit line pair $(D_1, \overline{D_1})$, while MISFETs $Q_{41}$ to $Q_{43}$ in combination constitute a differential sense amplifier provided for a digit line pair $(D_2, \overline{D_2})$. Resistors $R_3$ and $R_4$ are common loads to these sense amplifiers. The sense amplifiers are selectively enabled by the output of a column decoder 12 which receives column address signals $A_{i+1}$ to $A_m$. For example, if an output $Y_1$ of the column decoder 12 is selected, the sense amplifier constituted by the MISFETs $Q_{38}$ to $Q_{40}$ is actuated to amplify the data on the digit line pair $(D_1, \overline{D_1})$ and deliver the amplified data to read lines DB and $\overline{DB}$. The read line DB is connected to the gate of a MISFET $Q_{32}$ at an output stage through an inverter constituted by a depletion-mode MISFET $Q_{36}$ and an MISFET $Q_{37}$, while the read line $\overline{DB}$ is connected to the gate of an MISFET $Q_{31}$ at an output stage through an inverter constituted by a depletion-mode MISFET $Q_{34}$ and an MISFET $Q_{35}$. A short-circuiting MISFET $Q_{33}$ is connected between the gate of the MISFET $Q_{31}$ and the gate of the MISFET $Q_{32}$. To the gate of the MISFET $Q_{33}$, a signal $\phi_1'$ is applied which is generated in accordance with the detection of change in at least one of the address inputs $A_1$ to $A_m$ by a change detection circuit 13. The signal $\phi_1'$ corresponds to the signal $V\phi_1$ shown in FIG. 3.

In this memory circuit, when the address inputs $A_1$ to $A_m$ change and a new reading cycle is entered, the control signal $\phi_1'$ is generated in the form of a pulse to turn ON the MISFET $Q_{33}$ thereby to equalize the potentials at the gates of the MISFETs $Q_{31}$ and $Q_{32}$. Then, the control signal $\phi_1'$ is disenergized to turn OFF the MISFET $Q_{33}$, so that the levels of the gates of the MISFETs $Q_{31}$ and $Q_{32}$ are determined according to the data read out from the addressed memory cell. In this case, the gates of the MISFETs $Q_{31}$ and $Q_{32}$ can be changed to predetermined levels, respectively, at a high speed, since the gates are previously placed at an intermediate level.

Figure 5:
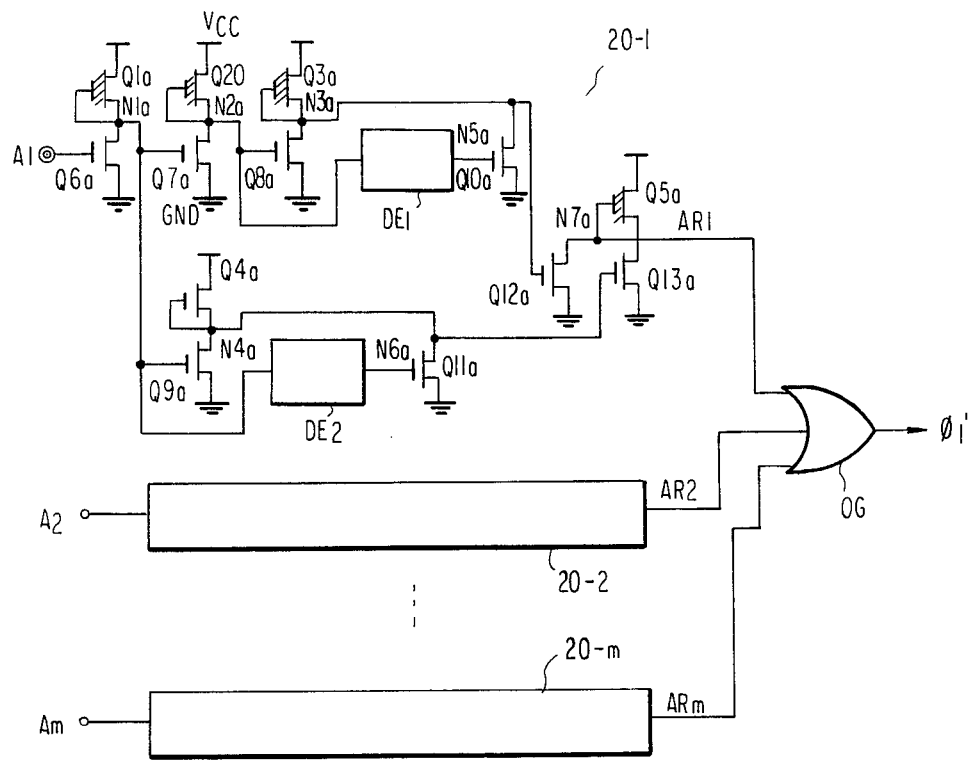
FIG. 5 shows an example of a circuit for generating a signal $\phi_1'$ shown in FIG. 4.

The circuit 13 for generating the control signal $\phi_1'$ will be explained hereinunder with reference to FIG. 5.

Address change detecting circuits 20-1, 20-2 ... and 20-m are provided for the address inputs $A_1$, $A_2$ ... and $A_m$, respectively. Each of the detecting circuits are adapted to generate one-shot pulses $AR_1$ to $AR_m$, respectively, when the corresponding address inputs have changed. These pulse outputs $AR_1$ to $AR_m$ are passed through an OR circuit OG so as to be delivered as the signal 100 1'. The address change detecting circuit 20-1 includes depletion-mode MISFETs $Q_{1a}$ to $Q_{5a}$, enhancement-mode MISFETs $Q_{6a}$ to $Q_{13a}$ and delay circuit $DE_1$ and $DE_2$. When the input $A_1$ changes from the high level to the low level, a node $N_{1a}$ changes from the low level to the high level, and a node $N_{4a}$ changes from the high level to the low level, and moreover the MISFET $Q_{13a}$ is turned OFF. On the other hand, a node $N_{2a}$ changes from the high level to the low level. Since a node $N_{5a}$ holds the high level by a delay time provided by the delay circuit $DE_1$, however, a node $N_{3a}$ maintains the low level, and since the MISFET $Q_{12a}$ is OFF, a node $N_{7a}$ acts to generate a high-level one-shot pulse only during the delay time. To the contrary, when the input $A_1$ changes from the low level to the high level, the node $N_{1a}$ changes from the high level to the low level. Since a node $N_{6a}$ holds the high level by a delay time provided by the delay circuit $DE_2$, the node $N_{4a}$ maintains the low level, and the MISFET $Q_{13a}$ is OFF during the delay time. Moreover, since the node $N_{2a}$ changes from the low level to the high level in response to the change in level of the node $N_{1a}$, the node $N_{3a}$ changes from the high level to the low level, so that the MISFET $Q_{12a}$ is turned OFF and the node $N_{7a}$ acts to generate the one-shot pulse $AR_1$ only during the delay time. Accordingly, when the address input has changed, a one-shot pulse is generated as $AR_1$ at the node $N_{7a}$ only during the delay time provided by the delay circuit $D_1$ or $D_2$.

Figure 6:
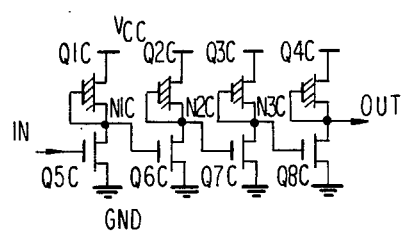
FIG. 6 shows an example of a delay circuit employed in the circuit shown in FIG. 5.

FIG. 6 shows an example of the arrangement of the delay circuit. Reference symbols $Q_{1C}$ to $Q_{4C}$ denote depletion-mode MISFETs, while symbols $Q_{5C}$ to $Q_{8C}$ represent enhancement-mode MISFETs, respectively. The circuit is constituted by inverters forming four stages, so that a delay time corresponding to the sum of the delay times between the inputs and outputs of all the inverters is accumulated between the input IN and output OUT of the delay circuit. It is to be noted that the input IN and output OUT of this circuit are of in-phase logical levels since the circuit is constituted by the four-stage inverters. In addition, the delay time can be regulated to a proper value by varying a ratio of the driving transistor and the load in the inverters.

As has been described through the embodiments, according to the invention, it is possible to provide an output circuit having a high operating speed.

Although the description has been set forth about the case where the N-channel MISFETs are employed, the N-channel MISFETs are not exclusive and the invention can be applied to an output circuit employing P-channel MISFETs, provided that the polarity thereof is properly inverted.

I claim:

1. An output circuit comprising a first voltage terminal receiving one of potentials of binary logic levels, a second voltage terminal receiving the other of potentials of said binary logic levels, a series circuit of first and second field effect transistors connected between said first and second voltage terminals, an output terminal coupled to an intermediate junction of said series circuit, data means for operatively generating a first signal and a second signal having an opposite phase to said first signal, means for applying said first signal to a gate of said first transistor, means for applying said second signal to a gate of said second transistor, short-circuit means directly coupled between the gates of said first and second transistors for operatively providing a current path between the gates of said first and second transistor, thereby to make potentials of the gates of said first and second transistors substantially equal each other, and control means for enabling said short-circuit means before said data means produces a renewed state of said first and second signals.

2. The circuit according to claim 1, in which said data means includes a first inverter circuit for generating said first signal and a second inverter circuit for generating said second signal.

3. The circuit according to claim 1, in which said short-circuit means includes a third field effect transistor having a drain-source current path directly coupled between the gates of said first and second transistors.

4. The circuit according to claim 1, in which said data means receives a read-out signal from a selected memory cell in a memory device.

5. The circuit according to claim 4, in which said control means includes a detection circuit for detecting a change in at least one address signal applied to said memory device.

6. An output circuit for outputting a read-out signal from a selected memory cell in a memory device receiving address signals, comprising a first transistor coupled between a first voltage terminal and an output terminal, a second transistor coupled between said output terminal and a second voltage terminal, a potential of said first voltage terminal defining one of binary logic level, a potential of said second voltage terminal defining the other of said binary logic levels, a data circuit for generating first and second signals having mutually opposite phases in response to said read-out signal, means for supplying the control electrode of said first transistor with said first signal, means for supplying a control electrode of said second transistor with said second signal, a third transistor having a source-drain path directly coupled between the control electrodes of said first and second transistors, and control means for operatively making said third transistor conductive every time when at least one of said address signal is changed.

7. An output circuit for outputting read-out data produced on a pair of buss lines from a selected memory all in a memory device of the type having a plurality of memory cells arranged in rows and columns, first means for receiving address signals, second means responsive to a first part of said address signals for selecting one of said rows, third means responsive to a second remaining portion for selecting one of said columns, and fourth means for operatively producing read-out data from the selected column on said pair of bus lines in complementary form, said read-out data on said pair of bus lines being established after a predetermined delay time with respect to the receipt of renewed address signals, comprising a first field effect transistor having a source-drain current path connected between a power voltage terminal and an output terminal, a second field effect transistor having a source-drain path coupled between said output terminal and a reference voltage terminal, means for connecting a gate of said first transistor to one of said pair of bus lines, means for connecting a gate of said second transistor to the other of said pair of bus lines, a third field effect transistor having a source-drain current path directly connected between the gates of said first and second transistors, detecting means for detecting change in at least one of said address signals, and control means for operatively rendering said third transistor conductive at least a part of said predetermined delay time from a time when said detecting means detects change in at least one of said address signals.

8. The invention according to claim 7, in which said detecting means includes a plurality of detection unit circuits each adapted to receive each one of said address signals, each of said detection units circuits including a first delay circuit for delaying a first signal of the same phase as the address signal applied thereto, and a second delay circuit for delaying a second signal of the opposite phase to said first signal.

9. The invention according to claim 8, in which said memory cell are of a static-type.

* * * * *